United States Patent
Chen et al.

(10) Patent No.: US 9,236,411 B2
(45) Date of Patent: Jan. 12, 2016

(54) COLOR FILTER PATTERNING USING HARD MASK

(75) Inventors: Gang Chen, San Jose, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1035 days.

(21) Appl. No.: 13/197,568

(22) Filed: Aug. 3, 2011

(65) Prior Publication Data
US 2013/0033627 A1 Feb. 7, 2013

(51) Int. Cl.
*H01L 29/49* (2006.01)
*H01L 27/146* (2006.01)

(52) U.S. Cl.
CPC ...... *H01L 27/14621* (2013.01); *H01L 27/1464* (2013.01); *H01L 27/14685* (2013.01)

(58) Field of Classification Search
CPC .............. H01L 27/14621; H01L 27/1464
See application file for complete search history.

(56) References Cited

U.S. PATENT DOCUMENTS

| | | | |
|---|---|---|---|
| 4,934,791 A * | 6/1990 | Shimizu et al. | 349/107 |
| 7,518,683 B2 | 4/2009 | Inoue et al. | |
| 7,924,504 B2 * | 4/2011 | Su et al. | 359/586 |
| 7,935,560 B2 * | 5/2011 | Anderson et al. | 438/70 |
| 2003/0071271 A1 * | 4/2003 | Suzuki et al. | 257/98 |
| 2008/0036020 A1 * | 2/2008 | Ko et al. | 257/431 |
| 2008/0055733 A1 * | 3/2008 | Lim | 359/619 |
| 2008/0128843 A1 * | 6/2008 | Lee | 257/432 |
| 2008/0157244 A1 * | 7/2008 | Yun et al. | 257/432 |
| 2009/0315131 A1 * | 12/2009 | Hung et al. | 257/432 |
| 2009/0321865 A1 * | 12/2009 | Kasano et al. | 257/432 |
| 2010/0196683 A1 | 8/2010 | Haskal | |
| 2011/0180892 A1 * | 7/2011 | Jang et al. | 257/432 |
| 2011/0226934 A1 | 9/2011 | Tian et al. | |
| 2011/0298074 A1 * | 12/2011 | Funao | 257/432 |
| 2013/0033627 A1 * | 2/2013 | Chen et al. | 348/280 |
| 2013/0154041 A1 * | 6/2013 | Kokubun et al. | 257/432 |
| 2013/0181268 A1 | 7/2013 | Hirota | |
| 2013/0264671 A1 * | 10/2013 | Yun et al. | 257/432 |
| 2013/0299994 A1 * | 11/2013 | Park et al. | 257/774 |
| 2013/0316487 A1 | 11/2013 | de Graff et al. | |
| 2014/0145282 A1 * | 5/2014 | Shen et al. | 257/432 |

(Continued)

FOREIGN PATENT DOCUMENTS

| | | |
|---|---|---|
| CN | 101136423 A | 3/2008 |
| CN | 101192619 A | 6/2008 |

(Continued)

OTHER PUBLICATIONS

CN 2011-10461303.X—First Chinese Office Action with English Translation, issued Sep. 3, 2014, 19 pages.
TW 100144238—First Taiwan Office Action with English Translation, issued Oct. 17, 2014, 14 pages.
CN 2011-10461303.X—Second Chinese Office Action with English Translation, issued Apr. 21, 2015, 11 pages.

*Primary Examiner* — Michael Shingleton
(74) *Attorney, Agent, or Firm* — Blakely Sokoloff Taylor & Zafman LLP

(57) ABSTRACT

Embodiments are disclosed of an apparatus comprising a color filter arrangement including a set of color filters. The set of color filters includes a pair of first color filters, each having first and second hard mask layers formed thereon, a second color filter having the first hard mask layer formed thereon, and a third color filter having no hard mask layer formed thereon. Other embodiments are disclosed and claimed.

15 Claims, 6 Drawing Sheets

(56) References Cited

U.S. PATENT DOCUMENTS

| | | |
|---|---|---|
| 2014/0175586 A1* | 6/2014 | Kim et al. ............... 257/432 |
| 2014/0199803 A1* | 7/2014 | Kurihara et al. ........... 438/70 |
| 2014/0210028 A1* | 7/2014 | Chen et al. .............. 257/432 |
| 2014/0220775 A1* | 8/2014 | Ryan et al. .............. 438/643 |

FOREIGN PATENT DOCUMENTS

| | | |
|---|---|---|
| CN | 101414580 A | 4/2009 |
| CN | 101604700 A | 12/2009 |
| CN | 102136486 A | 7/2011 |

* cited by examiner

PLAN VIEW

SECTION B-B

PLAN VIEW  SECTION 1-1

PLAN VIEW  SECTION 1-1

COLOR FILTER PATTERNING USING HARD MASK

TECHNICAL FIELD

The present invention relates generally to image sensors and in particular, but not exclusively, to color filter patterning in an image sensor using a hard mask.

BACKGROUND

With pixel size scaling down, design rules for color filters should follow the trend and allow the color filters to be scaled down as well, but due to specific processing features of the color filters the scaling is challenging and painful. Introducing new materials is a common approach for improving color filter scaling, but light transmission, process controllability, yield, delivery, and overall optical performance could be sacrificed.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method for color filter patterning using a hard mask are described. Numerous specific details are described to provide a thorough understanding of the embodiments of the invention, but one skilled in the relevant art will recognize that the invention can be practiced without one or more of the specific details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
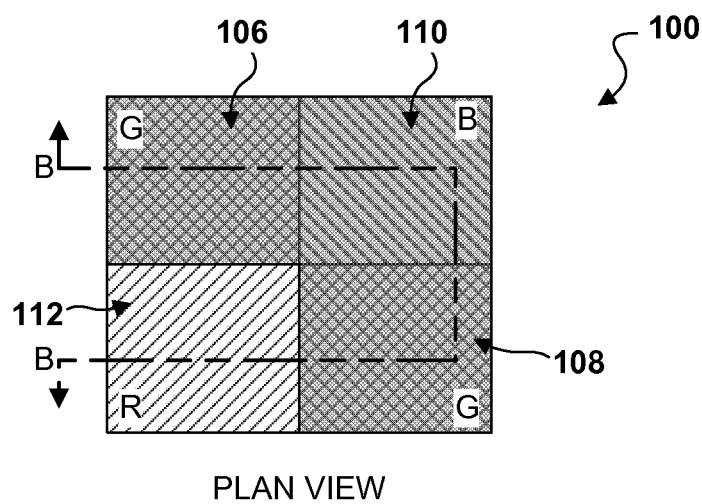
FIG. 1A is a plan view of an embodiment of a color filter arrangement.
Figure 1B:
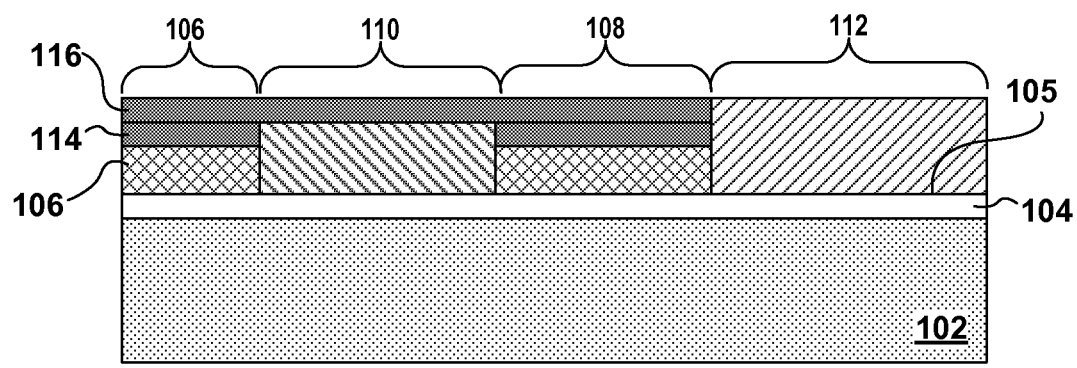
FIG. 1B is a cross-sectional view of the embodiment of a color filter arrangement shown in FIG. 2A, taken substantially along section line B-B.

FIGS. 1A-1B illustrate an embodiment of a color filter arrangement 100 for a group of four pixels; FIG. 1A is a plan view, while FIG. 1B is a cross-sectional view taken substantially along section line B-B. Color filter arrangement 100 can be implemented in a frontside-illuminated (FSI) sensor as shown in FIG. 2B or a backside-illuminated (BSI) sensor as shown in FIG. 2C.

Color filter arrangement 100 includes four color filters: first and second filters 106 and 108 of a first color, third filter 110 of a second color, and fourth filter 112 of a third color. In the illustrated embodiment the first color is green, the second color is blue and the third color is red, and the filters are arranged to form the familiar red-green-blue (RGB) Bayer pattern. In other RGB embodiments, however, there can be different numbers of each color and the colors can be arranged differently than shown. In still other embodiments the colors used in the filter arrangement can be different—cyan, magenta and yellow (CMY), for instance—and can have any distribution and any number of each color.

The four color filters 106, 108, 110 and 112 are formed on a surface of planarization layer 104. A first hard mask layer 114 and a second hard mask layer 116 are formed over first color filter 106 and second color filter 108, while only second hard mask layer 116 is formed over third color filter 110. No hard mask layer is formed over fourth color filter 112. Hard mask layers 114 and 116 are substantially optically transparent in the wavelengths of interest. In one embodiment hard mask layers 114 and 116 are oxide layers, but in other embodiments other materials can be used provided they meet optical performance and manufacturing requirements. By using oxides or other material with good light transmission properties, the "old" low cost, mature, optimized color filter materials can extend their application to pixels of any size, the only limit being patterning resolution, which is smaller than the shortest wavelength of the visible light.

Figure 2A:
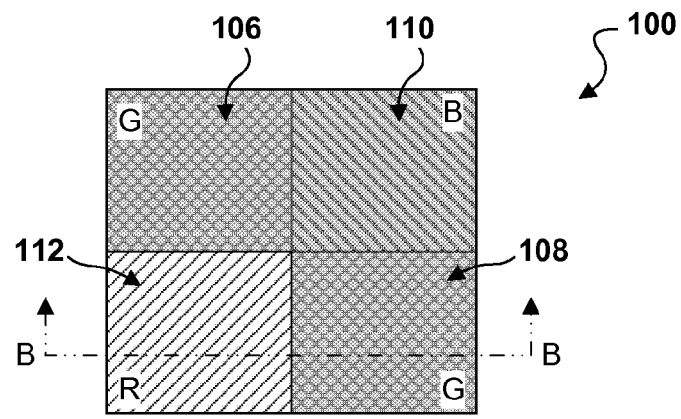
FIG. 2A is another plan view of the color filter arrangement shown in FIG. 1A.
Figure 2B:
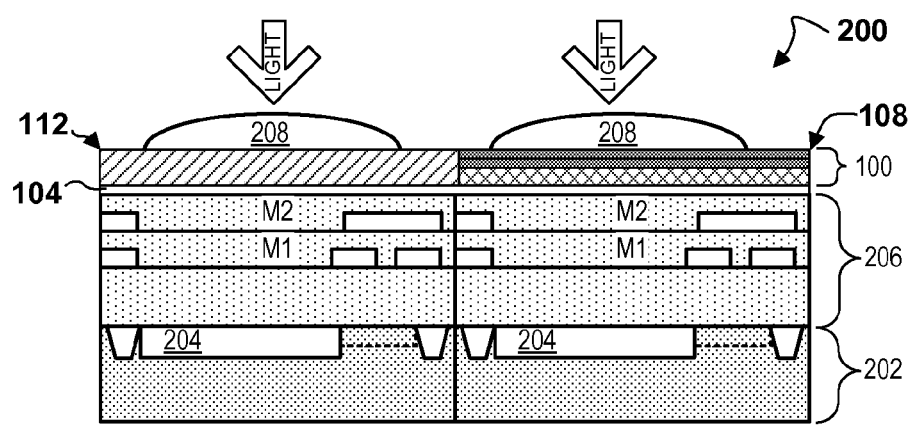
FIG. 2B is a cross-sectional view of the embodiment of a color filter arrangement shown in FIG. 2A, taken substantially along section line B-B and used together with an embodiment of frontside-illuminated pixels.
Figure 2C:
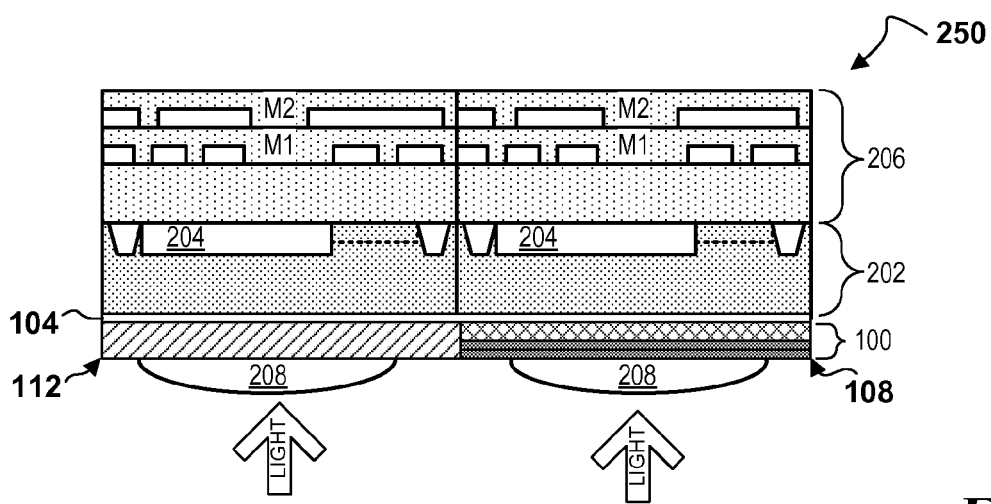
FIG. 2C is a cross-sectional view of the embodiment of a color filter arrangement shown in FIG. 2A, taken substantially along section line B-B and used together with an embodiment of backside-illuminated pixels.

FIGS. 2A-2C illustrate embodiments in which color filter arrangement 100 can be used together with frontside-illuminated (FSI) pixels (FIG. 2B) or backside-illuminated (BSI) pixels (FIG. 2C). The figures illustrate the application of color filter arrangement 100 to a group of four pixels, but in an actual pixel array having large numbers of pixels the illustrated arrangement can be replicated numerous times depending on the number of pixels in the array.

FIG. 2A illustrates color filter arrangement 100, which includes four color filters: first and second filters 106 and 108 of a first color, third filter 110 of a second color, and fourth filter 112 of a third color. In the illustrated embodiment the first color is green, the second color is blue and the third color is red, and the three colors are arranged to form the familiar red-green-blue (RGB) Bayer pattern. In other RGB embodiments, however, there can be different numbers of each color and the colors can be arranged differently than shown. In still other embodiments the colors used in filter arrangement 100 can be different—cyan, magenta and yellow (CMY), for instance—and can have any arrangement and any number of each color.

FIG. 2B illustrates a cross-section, taken along section B-B in FIG. 2A, of an embodiment of frontside-illuminated (FSI) pixels 200 in a CMOS image sensor, where the FSI pixels 200 use a color filter arrangement such as color filter arrangement 100. The front side of FSI pixels 200 is the side of substrate upon which the photosensitive area 204 and associated pixel circuitry are disposed, and over which metal stack 206 for redistributing signals is formed. Metal stack 206 includes metal layers M1 and M2, which are patterned to create an optical passage through which light incident on the FSI pixels 200 can reach photosensitive or photodiode regions 204. To implement a color image sensor, the front side includes color filter arrangement 100, with each of its individual color filters (individual filters 108 and 112 are illustrated in this particular cross section) disposed under a microlens 208 that aids in focusing the light onto photosensitive region 204.

FIG. 2C illustrates a cross-section, taken along section B-B in FIG. 2A, of an embodiment of backside-illuminated (BSI) pixels 250 in a CMOS image sensor, where the BSI pixels use a color filter arrangement such as color filter arrangement 100. As with the pixels 200, the front side of pixels 250 is the side of substrate upon which the photosensitive regions 204 and associated pixel circuitry are disposed, and over which metal stack 206 is formed for redistributing signals. The backside is the side of the pixels opposite the front side. To implement a color image sensor, the backside includes color filter arrangement 100, with each of its individual color filters (individual filters 108 and 112 are illustrated in this particular cross section) disposed under a microlens 208. Microlenses 208 aid in focusing the light onto photosensitive regions 204. Backside illumination of pixels 250 means that the metal interconnect lines in metal stack 206 do not obscure the path between the object being imaged and the photosensitive regions 204, resulting in greater signal generation by photosensitive regions.

Figure 3A:
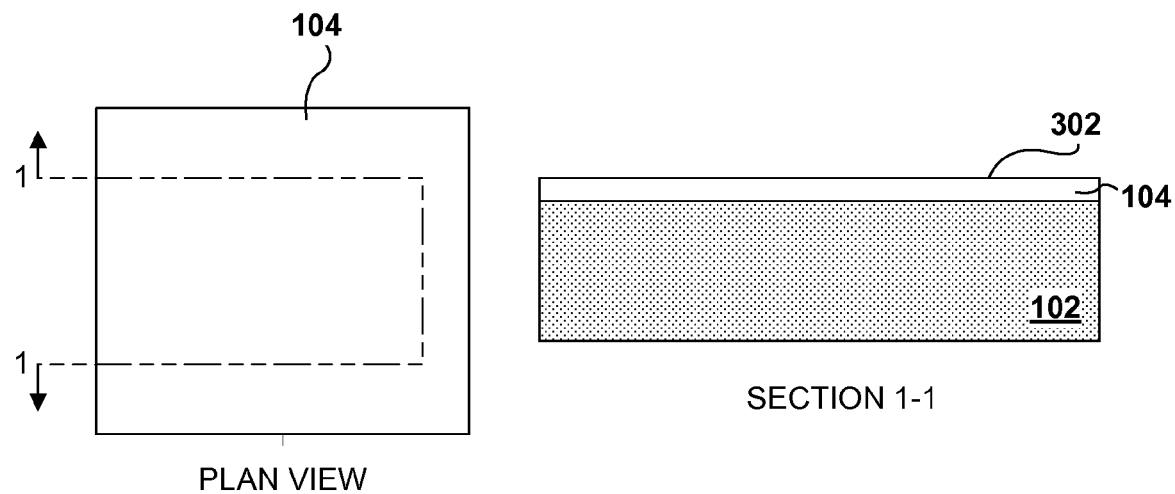
FIGS. 3A-3H are plan views (left side) and corresponding cross-sectional views (right side) illustrating an embodiment of a process for manufacturing a color filter arrangement such as the one shown in FIGS. 1A-1B and/or 2A-2C.

FIGS. 3A-3H illustrate an embodiment of a process for manufacturing an embodiment of a color filter arrangement such as color filter arrangement 100. FIG. 3A shows an initial part of the process, which begins with substrate 102 having a planarizing layer 104 deposited thereon and planarized using processes such as chemical mechanical polishing (CMP) to form a planar surface 302 on which color filter arrangement 100 can be formed.

Figure 3B:
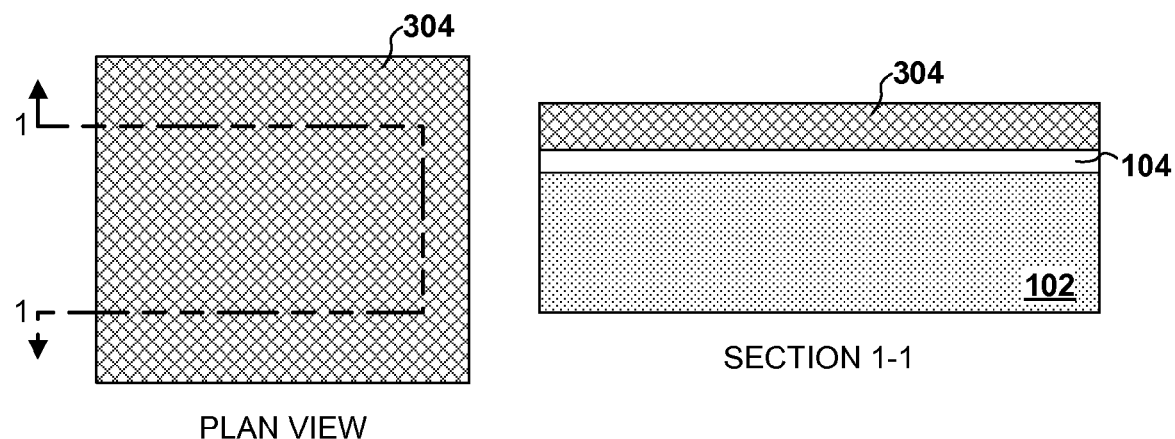

FIG. 3B illustrates a next part of the process. Starting with the build-up shown in FIG. 3A, a first color filter layer 304 is deposited onto planar surface 302 and is then planarized using processes such as chemical mechanical polishing (CMP).

Figure 3C:
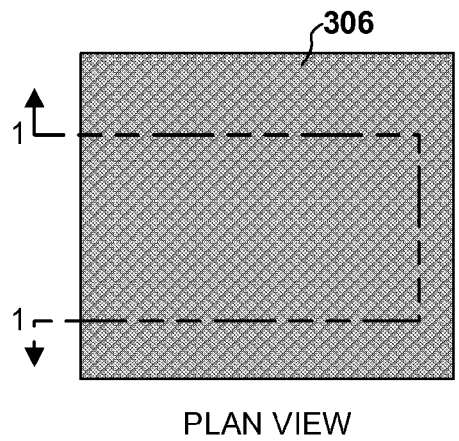
Figure 3C:
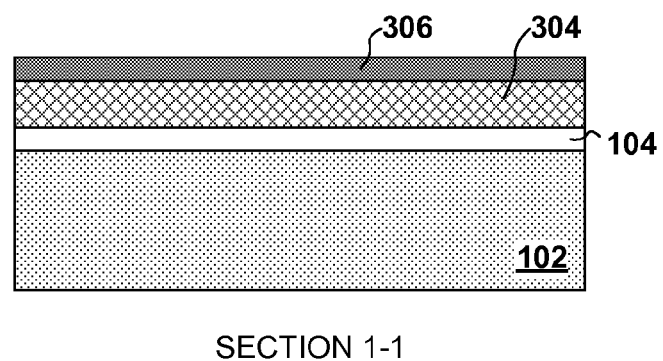

FIG. 3C illustrates a next part of the process. Starting with the build-up shown in FIG. 3B, a first hard mask layer 306 is deposited on the first color filter layer 304 and then planarized using processes such as chemical mechanical polishing (CMP). In one embodiment first hard mask layer 306 is an oxide layer, but in other embodiments other materials can be used to form first hard mask layer 306, provided the chosen material meets optical performance and manufacturing requirements.

Figure 3D:
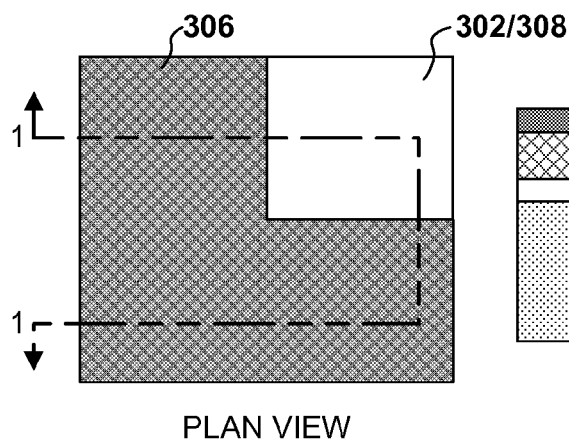
Figure 3D:
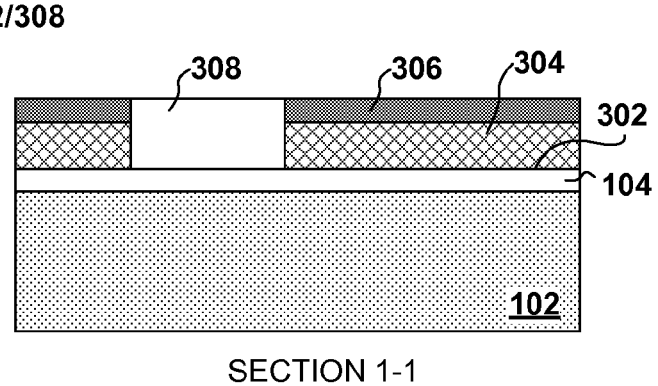

FIG. 3D illustrates a next part of the process. Starting with the build-up shown in FIG. 3C, an opening 308 is formed through first hard mask layer 306 and first color filter layer 304, down to planar surface 302 of planarizing layer 104. In one embodiment, opening 308 can be formed using photolithographic patterning together with etching processes such as anisotropic etching, deep reactive ion etching (DRIE), and the like. In other embodiments other processes, such as laser ablation or etching, can be used to form opening 308.

Figure 3E:
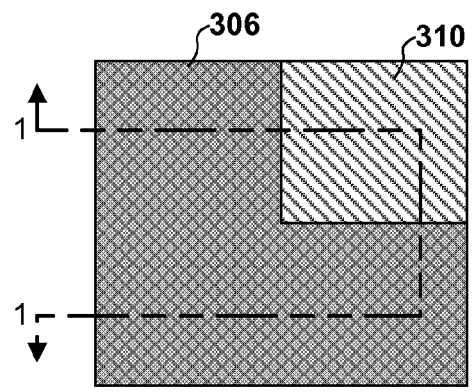
Figure 3E:
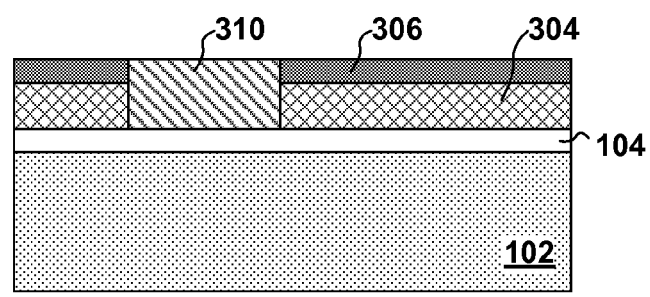

FIG. 3E illustrates a next part of the process. Starting with the build-up shown in FIG. 3D, a second color filter layer 310 is deposited into opening 308 to form a color filter of a second color. As in previous steps, after second color filter layer 310 is deposited the entire build-up can be planarized using processes such as chemical mechanical polishing (CMP).

Figure 3F:
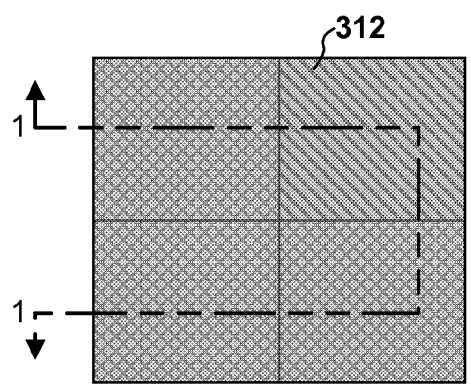
Figure 3F:
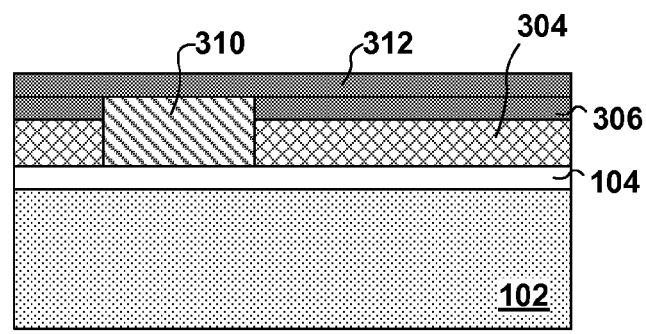

FIG. 3F illustrates a next part of the process. Starting with the build-up shown in FIG. 3E, a second hard mask layer 312 is deposited over the assembly and then planarized using processes such as chemical mechanical polishing (CMP). In one embodiment second hard mask layer 312 is an oxide layer, but in other embodiments other materials can be used provided the chosen material meets optical performance and manufacturing requirements. In one embodiment second hard mask layer 312 can be made of the same material as first hard mask layer 306, but in other embodiments the first and second hard mask layers need not be made using the same material.

Figure 3G:
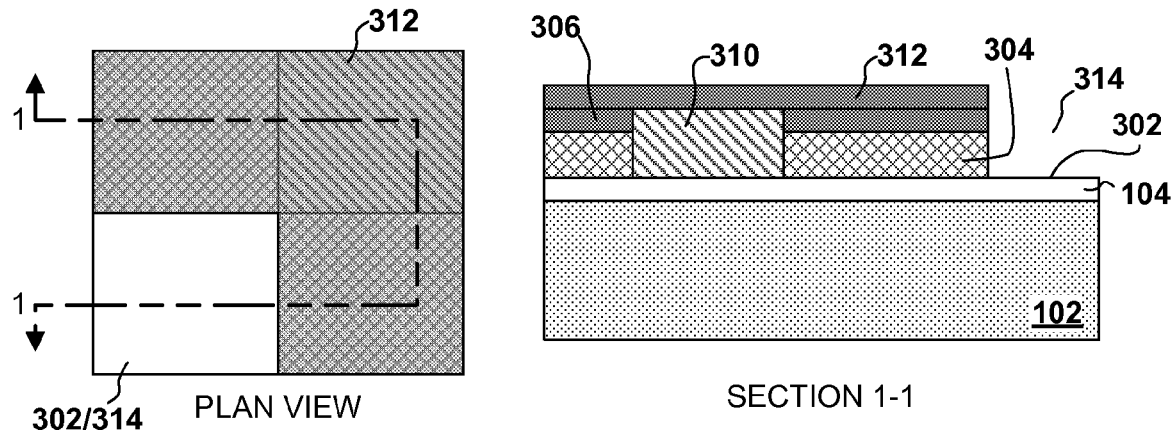

FIG. 3G illustrates a next part of the process. Starting with the build-up shown in FIG. 3F, an opening 314 is etched through first hard mask layer 306, second hard mask layer 312 and first color filter layer 304, down to planar surface 302 of planarizing layer 104. Opening 314 can be formed using photolithographic patterning together with etching processes such as anisotropic etching, deep reactive ion etching (DRIE), and the like. In other embodiments other processes, such as laser ablation or etching, can be used to form opening 314.

Figure 3H:
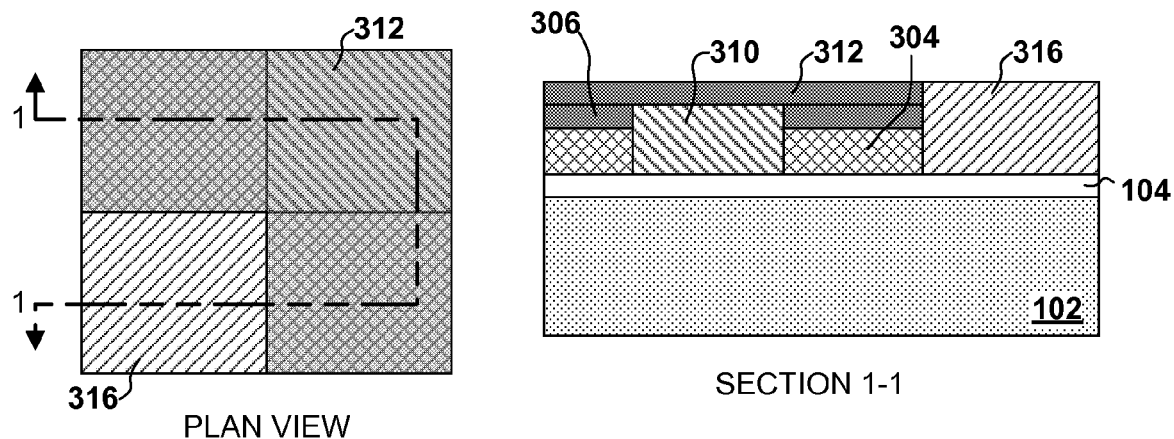

FIG. 3H illustrates the final part of the process. Starting with the build-up shown in FIG. 3G a third color filter layer 316 is deposited into opening 314 to form a color filter of a third color. As in previous steps, after second color filter layer 316 is deposited the entire build up can be planarized using processes such as chemical mechanical polishing (CMP). The color filter arrangement shown in FIG. 3H is essentially the color filter arrangement 100 shown in FIGS. 1A-1B.

The above description of illustrated embodiments of the invention, including what is described in the abstract, is not intended to be exhaustive or to limit the invention to the precise forms disclosed. Specific embodiments of, and examples for, the invention are described for illustrative purposes, but various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
a color filter arrangement including a set of color filters having a substantially planar bottom surface adapted to be placed on a surface of a substrate that includes a semiconductor layer having a pixel array formed in or on a front surface thereof, the set of color filters comprising:
first and second filters of a first color, each of the first and second filters having first and second hard mask layers thereon,
a third filter of a second color, the third filter having the second hard mask layer thereon, and
a fourth filter of a third color, the fourth filter having no hard mask layer thereon,
wherein the first, second, third, and fourth filters form the bottom surface of the color filter arrangement and the first and second hard masks and the fourth filter form a top surface of the color filter arrangement.

2. The apparatus of claim 1 wherein the first color filter is green, the second color filter is blue and the third color filter is red.

3. The apparatus of claim 2 wherein the set of color filters is arranged in a Bayer pattern.

4. The apparatus of claim 1 wherein the set of color filters is planarized.

5. The apparatus of claim 4 wherein the third color filter and the first and second hard masks form a plane.

6. The apparatus of claim 1, wherein the substrate further includes a planarization layer adapted to be sandwiched between the semiconductor layer and the color filter arrangement.

7. An apparatus comprising:
- a substrate having a front side and a back side, wherein at least part of the substrate is a semiconductor layer;
- an image sensor including a pixel array formed in or on the front side of the semiconductor substrate;
- a color filter arrangement optically coupled to a corresponding number of pixels of the pixel array, the color filter arrangement having a substantially planar bottom surface adapted to be placed on a surface of the substrate, the color filter arrangement including a set of color filters comprising:
  - first and second filters of a first color, each of the first and second filters having first and second hard mask layers thereon,
  - a third filter of a second color, the third filter having the second hard mask layer thereon, and
  - a fourth filter of a third color, the fourth filter having no hard mask layer thereon
  - wherein the first, second, third, and fourth filters form the bottom surface of the color filter arrangement and the first and second hard masks and the fourth filter form a top surface of the color filter arrangement.

8. The apparatus of claim 7 wherein the first color filter is green, the second color filter is blue and the third color filter is red.

9. The apparatus of claim 8 wherein the set of color filters is arranged in a Bayer pattern.

10. The apparatus of claim 7 wherein the third color filter and the first and second hard masks form a plane.

11. The apparatus of claim 7, wherein the substrate further includes a planarization layer adapted to be sandwiched between the semiconductor layer and the color filter arrangement.

12. The apparatus of claim 7 wherein the color filter arrangement is formed on the front side of the substrate.

13. The apparatus of claim 12, further comprising one or more microlenses optically coupled to the color filter arrangement.

14. The apparatus of claim 7 wherein the color filter arrangement is formed on the back side of the substrate.

15. The apparatus of claim 12, further comprising one or more microlenses optically coupled to the color filter arrangement.

\* \* \* \* \*